(12) United States Patent
Lee et al.

(10) Patent No.: US 6,177,661 B1
(45) Date of Patent: Jan. 23, 2001

(54) HEATED STAGE FOR HOLDING WAFERS DURING SEMICONDUCTOR DEVICE FABRICATION

(75) Inventors: Joung-Sun Lee, Suwon; Tae-hyup Kim, Kyunki-do, both of (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 08/959,860

(22) Filed: Oct. 29, 1997

(30) Foreign Application Priority Data

Nov. 22, 1996 (KR) ................................................ 96-56736

(51) Int. Cl.[7] .............................. H05B 6/10; C23C 16/00
(52) U.S. Cl. ....................... 219/635; 219/647; 219/667; 219/444.1; 118/725; 118/728; 392/416
(58) Field of Search ..................................... 219/647, 649, 219/652, 634, 635, 638, 521, 385, 667, 444.1, 390, 405, 411; 118/724, 725, 728; 392/416, 418

(56) References Cited

U.S. PATENT DOCUMENTS

| | | | |
|---|---|---|---|
| 3,408,982 | * 11/1968 | Capita | 219/652 |
| 4,978,567 | * 12/1990 | Miller | 219/649 |
| 5,038,711 | * 8/1991 | Dan et al. | 118/728 |
| 5,183,402 | * 2/1993 | Cooke et al. | 432/253 |
| 5,242,501 | * 9/1993 | McDiarmid | 219/649 |
| 5,462,603 | * 10/1995 | Murakami | 118/728 |
| 5,472,749 | * 12/1995 | Dravid et al. | 427/580 |
| 5,478,401 | * 12/1995 | Tsunekawa et al. | 134/1 |
| 5,680,502 | * 10/1997 | Kim | 118/725 |
| 5,891,548 | * 4/1999 | Graiver | 428/98 |

* cited by examiner

Primary Examiner—Philip H. Leung
(74) Attorney, Agent, or Firm—Jones Volentine, LLC

(57) ABSTRACT

A wafer holding stage used during a semiconductor device fabricating process decreases the number of particles that accumulate on a wafer. The wafer holding stage includes a stage having an upper surface for holding a wafer and a heating element disposed inside the stage for raising temperatures of the upper surface to a holding temperature above an ambient temperature. The heating element may be a heating wire for producing heat when supplied with a electric current or a heat exchange tube for carrying a heated fluid. The wafer holding stage may further comprise a low temperature particle collector, having a surface maintained at a collecting temperature below the ambient temperature, spaced apart a small distance from the stage.

12 Claims, 3 Drawing Sheets

HEATED STAGE FOR HOLDING WAFERS DURING SEMICONDUCTOR DEVICE FABRICATION

BACKGROUND OF THE INVENTION

1. Field of the Invention

The present invention relates to a stage for holding a wafer during semiconductor device fabrication and, more particularly, to a stage which is heated in order to prevent particles in the air from accumulating on the wafer.

2. Discussion of Related Art

In general, semiconductor device fabrication involves multiple steps, including: a diffusion step for forming a thin film on the surface of a wafer; a heat treatment step; a photographic process for forming a previously set pattern on the wafer surface; an etching process for realizing the pattern; an ion implanting process for producing an intended electric characteristic in the film; and a thin film process for making the film thinner and more uniform. After these processes, the wafer is examined in a testing/measuring process to determine whether the desired effect has been achieved.

Testing/measuring facilities are designed specifically to test each wafer one at a time after each wafer is laid on a stage. The wafer is transported and tested while on this stage.

An example of a stage used in the testing/measuring processes is illustrated in the loadlock chamber of FIG. 1. The loadlock chamber serves as an airlock for a test chamber. The loadlock chamber has a wafer holder arm 4 and a stage 5 which is placed under the holder arm 4 in the load chamber 1. The loadlock chamber 1 further has an inner gate 2 and an outer gate 3. In the case where the loadlock chamber is used with a vacuum test chamber, the outer gate 3 is opened while the inner gate 2 is closed in order to protect the vacuum test chamber from the outside air. In that state, a wafer (not shown) is inserted and laid on the stage 5. Then, the outer gate 3 is closed and air from inside the loadlock chamber is removed by a suctioning process until its pressure matches the predetermined low pressure of the vacuum test chamber. Then the inner gate 2 is opened so that the wafer on the stage 5 of the load chamber can be moved to the vacuum test chamber.

However, even though the loadlock chamber is used in a clean room, each wafer is exposed to the air before being inserted into the test chamber. Therefore, particles remaining in the fresh air in the clean room or falling from the facilities or introduced by a worker, may accumulate or adhere onto the wafer. This contaminates the wafer 6, causes the product to be defective, and thus decreases the yield of the semiconductor device fabricating process.

SUMMARY OF THE INVENTION

The present invention is directed to a wafer holding stage used during a semiconductor device fabricating process that substantially overcomes one or more of the problems due to limitations and disadvantages of the related art.

A wafer holding stage for use in fabricating semiconductor devices comprises a stage having an upper surface for holding a wafer, and a heating element disposed inside the stage for raising temperatures of the upper surface to a holding temperature above an ambient temperature.

In another aspect a wafer holding stage is provided that further comprises a low temperature particle collector, having a surface maintained at a collecting temperature below ambient, spaced apart a small distance from the stage.

BRIEF DESCRIPTION OF THE ATTACHED DRAWINGS

The accompanying drawings illustrate embodiments of the invention, in which.

DETAILED DESCRIPTION OF PREFERRED EMBODIMENT

The invention is based on the principle that floating particles in the air cannot approach a heated stage due to the thermophoresis generated around the heated stage. Thermophoresis causes the particles to move from a high temperature area to a low temperature area. It is believed that thermophoresis is due to the thermal gradient around the heated stage, the convection currents established in the heated air, and the air density difference. The movement of the particles depends on both the characteristics of the particles and the characteristics of the fluid (mainly air) around the heated stage. Therefore a reduced-particle area, within which particles cannot adhere or accumulate readily, is formed around the heated stage.

Figure 1:
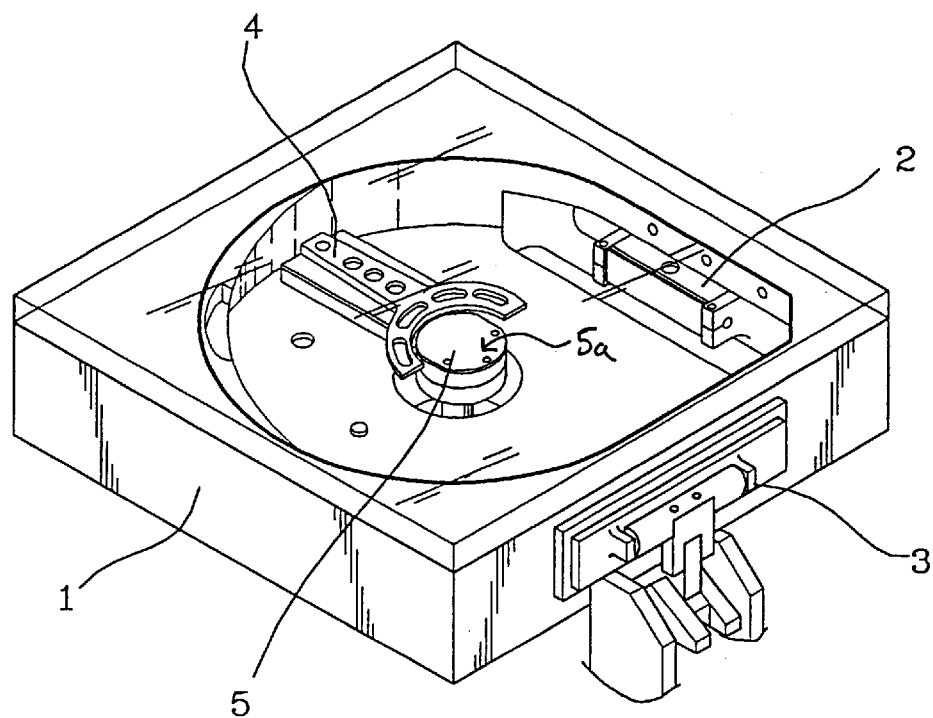
FIG. 1 is a perspective view of a loadlock chamber having a wafer holding stage employing the heating element of the present invention.

Referring to FIG. 1, the upper surface 5a of the stage 5 is heated to maintain a higher temperature than the ambient temperature. Thus, the heated stage 5 of the invention brings about the thermophoresis effect. Here, the ambient temperature is the controlled temperature inside the clean room where the semiconductor device is fabricated. Since the thermophoresis results from a temperature difference or a thermal gradient, the stage 5 and the wafer laid thereon are heated to a higher temperature than the actual measured ambient temperature.

The stage 5 is preferably maintained at a temperature in a range from about 5° C. higher than the ambient temperature to about 70° C. higher than the ambient temperature. When the temperature difference between the temperature of the stage 5 and the ambient temperature is less than 5° C., the temperature difference cannot induce a significant thermophoresis effect, and thus it is difficult to prevent particles from accumulating or adhering to the wafer 6 placed on the stage 5. On the other hand, when the temperature difference between the temperature of the stage 5 and the ambient temperature is more than 70° C., energy is wasted by the unnecessary heating, and also the wafer 6 can be damaged. Therefore, although the temperature difference between the stage 5 and the ambient temperature should be in the range from about 5° C. to about 70° C., it should preferably be kept between about 10° C. to about 60° C. above the ambient temperature.

For example, the stage 5 may be heated to a temperature in the range from a minimum heating temperature through 100° C. Here, the minimum heating temperature is defined so that the stage has a temperature at least 5° C. higher than the ambient temperature, thereby inducing the thermophoresis effect. As a further example, the minimum heating temperature can be fixed at about 30° C. on the assumption that the ambient temperature is maintained in the range of 20° C. through 25° C. Accordingly, if the ambient temperature is below 20° C., the minimum heating temperature may be below 30° C. Assuming a 20° C. ambient temperature, the stage 5 is preferably heated to a temperature in the range of about 30° C. through about 80° C. This preferred range will be described later with regard to the experimental results illustrated in FIG. 6.

Figure 2:
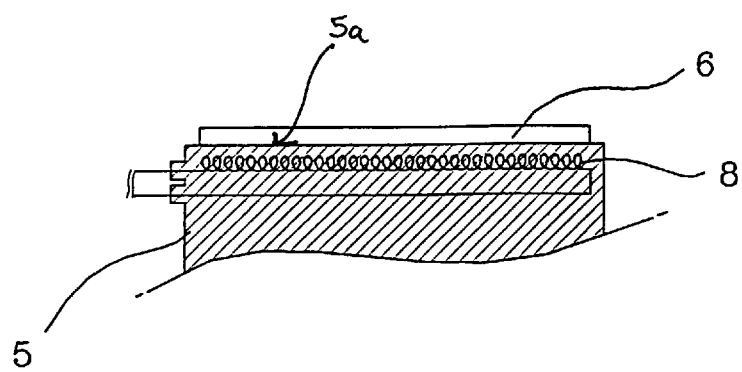
FIG. 2 is a sectional view of an embodiment of the invention.
Figure 3:
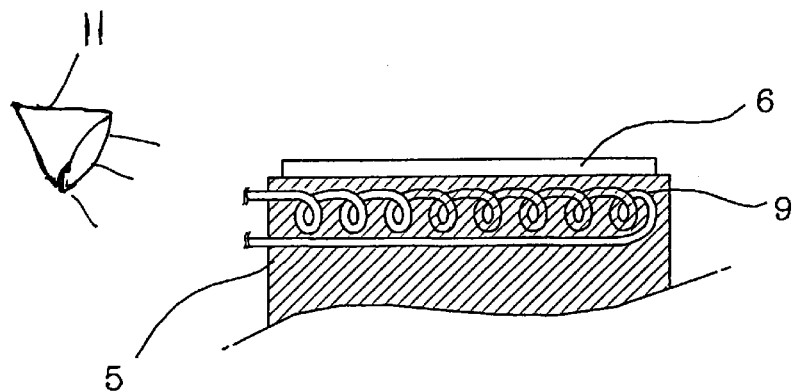
FIG. 3 is a sectional view of another embodiment of the invention.

The stage 5 can be heated by any of several heating methods and controlled by any suitable control means (8a in FIG. 2 and 9a in FIG. 3). FIG. 2 shows heating by a coil 8 contained in the stage 5, which can either be a heating wire or an induction coil, and in which the energy is supplied by an electrical current. FIG. 3 shows heating of the stage 5 by moving a high temperature fluid through a heat exchange coil 9 inside the stage 5. Besides the illustrated methods, the heating of the stage 5 can be accomplished by irradiating the stage 5 with high energy electro-magnetic waves such as ultraviolet rays from a source 11, or by an indirect heating source. Note that the heating may be accomplished by a combination of two or more of the above structures as well. The stage 5 is preferably heated by the heat or induction coil 8, which is useful for effective and rapid heating in a limited space.

In FIG. 2 the coil 8 easily generates the necessary Joule heat when supplied with an electric current. For example, a NICHROME wire can be used as the coil 8 in the stage 5. Alternately, the induction heating method is achieved by generating heat in the stage 5 using an induction coil supplied with an electric current. The heating method using a high temperature fluid, as illustrated in FIG. 3, is performed by moving heated air or heated nitride gas through a heat exchange coil 9 in the stage 5 so that the heat is conducted from the heat exchange coil 9 to the stage 5.

Figure 7:
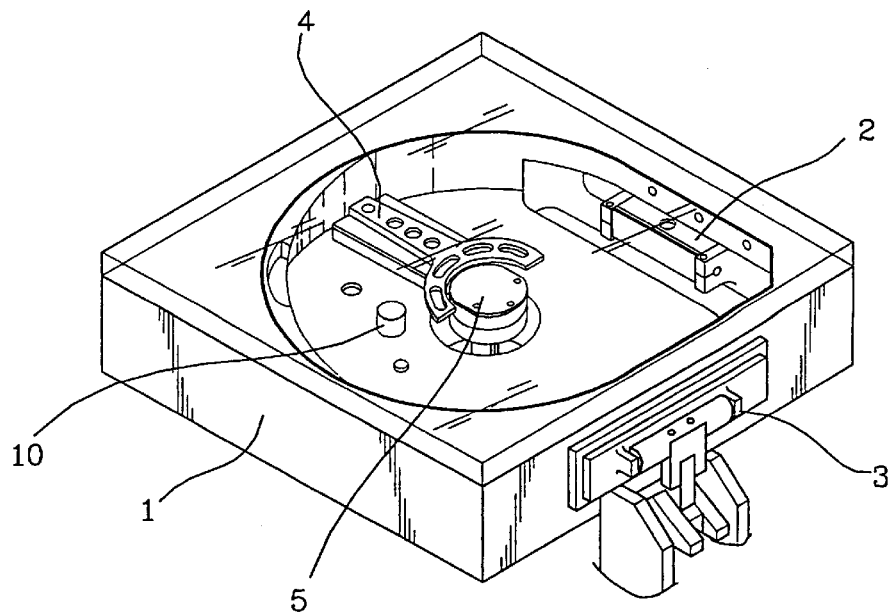
FIG. 7 is a perspective view of the loadlock chamber having the wafer holding stage along with a particle collector in another embodiment of the invention.

In addition to a heated stage 5, a low temperature particle collector 10 can be provided in the loadlock chamber as shown in FIG. 7. The particle collector 10 is placed near the heated stage 5, but separated from the heated stage 5 by a small distance. The particle collector 10 may be made of metal or a non-metal amorphous material. The low temperature particle collector 10 maintains a temperature lower than the ambient temperature using any suitable control means (10a in FIG. 7), therefore, particles in the air that move due to the thermophoresis effect are accumulated on the surface of the collector 10. This reduces the number of particles floating in the air so there are fewer particles available to contaminate the wafer 6.

Through experimentation, it has been observed, with the naked eye or by a microscope, that when air in which particles are floating makes contact with the surface of a low temperature object like the collector 10, as well as a high temperature object like the heated stage 5, the surface of the low temperature object contains more particles than the high temperature object does.

Based on experimental observations, the particle collector 10 is preferably maintained at a temperature range from about −10° C. through about 15° C., and more preferably, within the temperature range from about 0° C. through 10° C. A temperature below −10° C. is so low as to cause energy waste, and a temperature above 15° C. may reduce the low temperature particle collecting effect.

Figure 4:
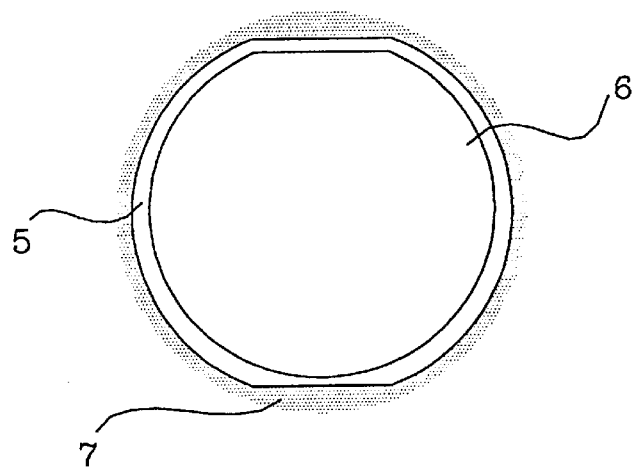
FIG. 4 is a plan view illustrating the state in which a reduced-particle area, depicted by the dotted area, is formed by the wafer holding stage of the invention.
Figure 5:
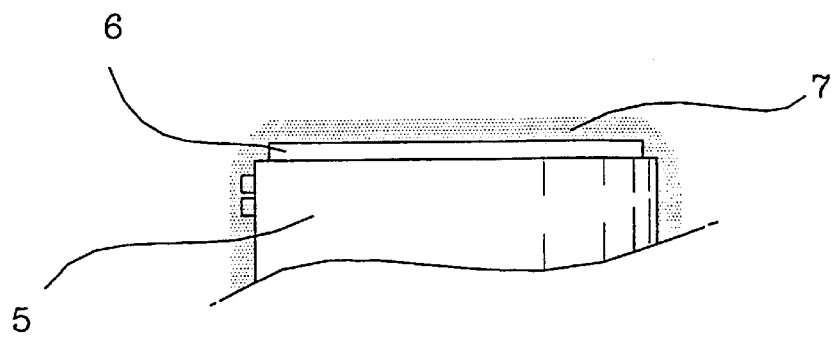
FIG. 5 is a side view illustrating the state in which a reduced-particle area, depicted by the dotted area, is formed by the wafer holding stage of the invention.

FIG. 4 is a plan view and FIG. 5 is a side view, respectively illustrating a state in which a reduced-particle area 7 is formed around the wafer holding stage by the heating elements of the present invention.

Experiments were performed in order to examine the reduced accumulation or adhesion of particles onto the heatable stage 5 of the invention. A set of pattern-less wafers were sequentially laid on the non-heated stage and the heated stages of the invention in a general clean room (i.e., below 1000 class). The wafers on the heated stage were heated to temperatures from 30° C. to 90° C. in steps of 10° C., which is above the ambient clean room temperature of 20–25° C. The non-heated stage was maintained at the ambient temperature. These wafers were then sampled to determine the number of the particles larger than 0.1 $\mu$m that had adhered or accumulated on the surface of each wafer. The measured results are illustrated in the graph of FIG. 6.

Figure 6:
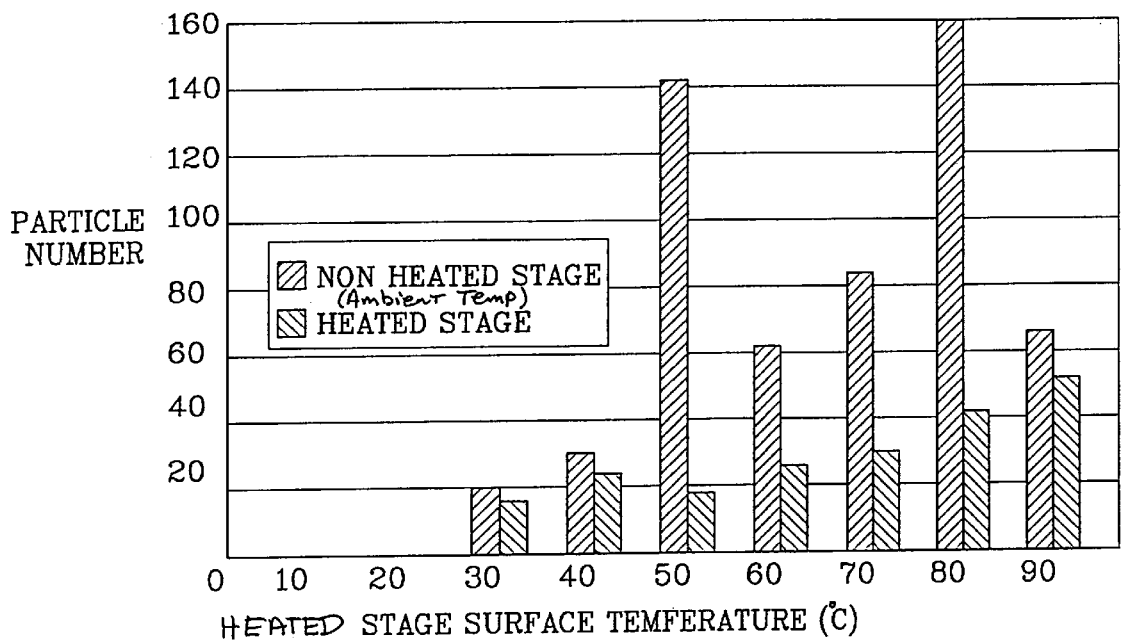
FIG. 6 is a graph illustrating the comparison of the deposited particle amount between the wafer on the stage of the invention and the wafer on the conventional non-heated stage.

As illustrated in FIG. 6, the numbers of the particles adhered to the surface of the wafer laid on the heated stage 5 through the range of temperatures from 30° C. to 90° C. are drastically lower than the number of the particles on the non-heated stage 5. Specifically, the heated stage is most highly effective in reducing particle accumulation in the temperature range of 50° C. to 80° C.

The present invention reduces the particles in the air that adhere to the wafer, thereby reducing wafer contamination, and enhancing the yield of the semiconductor device.

The wafer holding stage of the present invention has been particularly described in its preferred embodiments above. It will be apparent to those skilled in the art that various modifications and variations can be made in the wafer holding stage of the present invention without departing from the spirit or scope of the invention as defined in the appended claims and their equivalents.

Having thus described our invention, what we claim as new and desire to secure by Letters Patent is as follows:

1. A wafer holding stage for the manufacture of semiconductor devices, comprising:
    a stage having an upper surface for holding a wafer;
    a heating element disposed inside the stage for raising temperatures of the upper surface to a holding temperature above an ambient temperature;
    a first temperature control means for maintaining the temperature of the upper surface at the holding temperature, wherein the holding temperature is in a range from a minimum temperature up to about 100° C.;
    a particle collector for accumulating particles in an air in a loadlock chamber, the particle collector being spaced apart from the stage and having a surface maintained at a predetermined temperature below the ambient temperature and
    a second temperature control means for maintaining the surface of the particle collector at the predetermined temperature, the predetermined temperature being in a range from about −10° C. to about 15° C.

2. The wafer holding stage of claim 1, the heating element comprising a heating wire for producing heat when supplied with an electric current.

3. The wafer holding stage of claim 1, the heating element comprising an induction coil for producing heat when supplied with an electric current.

4. The wafer holding stage of claim 1, the heating element comprising a heat exchange coil for carrying a heated fluid.

5. The wafer holding stage of claim 4, wherein the heated fluid is heated nitride gas.

6. The wafer holding stage of claim 1, wherein the holding temperature is in a range from about 5° C. higher than the ambient temperature to about 70° C. higher than the ambient temperature.

7. The wafer holding stage of claim 1, wherein the holding temperature is in a range from about 10° C. higher than the ambient temperature to about 60° C. higher than the ambient temperature.

8. The wafer holding stage of claim 1, wherein the minimum temperature is 5° C. higher than the ambient temperature.

9. The wafer holding stage of claim 1, wherein the holding temperature is in the range from about 30° C. to about 80° C.

10. The wafer holding stage of claim 1, wherein the particle collector is formed from a metal.

11. The wafer holding stage of claim 1, wherein the particle collector is formed from a non-metal, amorphous material.

12. The wafer holding stage of claim 1, wherein the predetermined temperature is in a range from about 0° to about 10° C.

* * * * *